United States Patent
Han et al.

(10) Patent No.: US 11,654,786 B2
(45) Date of Patent: May 23, 2023

(54) CHARGING PORT COOLING WITH PHASE CHANGING MATERIAL AND POROUS HEAT CONDUCTOR CAGE

(71) Applicant: GM GLOBAL TECHNOLOGY OPERATIONS LLC, Detroit, MI (US)

(72) Inventors: Taeyoung Han, Bloomfield Hills, MI (US); Chih-hung Yen, Bloomfield Hills, MI (US); Kuo-huey Chen, Troy, MI (US); Bahram Khalighi, Birmingham, MI (US); Vicente Domenech-Llopis, Rochester Hills, MI (US); Srinivasa Rao Vaddiraju, Troy, MI (US); Satish P. Ketkar, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 253 days.

(21) Appl. No.: 17/074,541

(22) Filed: Oct. 19, 2020

(65) Prior Publication Data
US 2022/0118866 A1 Apr. 21, 2022

(51) Int. Cl.
*H02J 7/00* (2006.01)
*B60L 53/302* (2019.01)
*H05K 7/20* (2006.01)
*B60L 53/16* (2019.01)

(52) U.S. Cl.
CPC ............ *B60L 53/302* (2019.02); *B60L 53/16* (2019.02); *H05K 7/20881* (2013.01)

(58) Field of Classification Search
CPC .... B60L 53/302; B60L 53/16; H05K 7/20881
USPC ....................................................... 320/104, 109
See application file for complete search history.

(56) References Cited

U.S. PATENT DOCUMENTS

| | | | |
|---|---|---|---|
| 2006/0169507 A1* | 8/2006 | Inoue ............... | H01M 10/6557 180/68.4 |
| 2013/0029193 A1* | 1/2013 | Dyer ................ | H01M 10/6567 180/65.21 |
| 2015/0037994 A1* | 2/2015 | Nakajima ........... | H01R 13/631 439/304 |
| 2015/0137756 A1* | 5/2015 | Fukushima ......... | H01R 13/447 320/109 |
| 2015/0217654 A1* | 8/2015 | Woo ........................ | B60L 53/16 320/109 |
| 2019/0020140 A1* | 1/2019 | Fuehrer ................. | H01R 13/04 |
| 2019/0202302 A1* | 7/2019 | Turik ..................... | B60L 53/18 |
| 2020/0067237 A1* | 2/2020 | Sarraf ..................... | G01K 7/42 |
| 2020/0391603 A1* | 12/2020 | Ding ..................... | B60L 53/64 |
| 2020/0395147 A1* | 12/2020 | Shabgard .............. | B60L 53/18 |

* cited by examiner

*Primary Examiner* — Alexis B Pacheco

(57) ABSTRACT

An electric vehicle charging port includes a pair of charging pins each connected to a respective charging cable by a base. A pair of porous metallic cages surround the base of the pair of charging pins. A phase change material disposed in the pair of porous metallic cages and a vapor chamber is disposed between the base of the pair of charging pins and the pair of porous cage. The phase change material with an optional vapor chamber and high thermal conductivity (metal or graphite) foam or mesh to provide faster response of transient heat generation.

20 Claims, 4 Drawing Sheets

CHARGING PORT COOLING WITH PHASE CHANGING MATERIAL AND POROUS HEAT CONDUCTOR CAGE

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to cooling for a vehicle charging port.

Charging stations monitor the charge port pin temperature during DC fast charge operation, while charging electric vehicles. When the charge pin temperature is higher than a certain temperature (for example 70 C), then the charging systems de-rate from the full maximum charging to a very low charging rate (e.g. ⅕ rate). When even higher pin temperatures greater than the limit (e.g. 90 C) occur, the charging will shut down. It has been known to cool the charge pins with a liquid cooling loop which creates packaging constraints and requires plumbing and heat exchangers for cooling the liquid. Accordingly, it is desirable to prevent high charging pin temperatures and also greatly simplify the design without using complex cooling loops.

SUMMARY

This section provides a general summary of the disclosure, and is not a comprehensive disclosure of its full scope or all of its features.

An electric vehicle charging port includes a pair of charging pins each connected to a respective charging cable by a base. A pair of porous metallic cages surround the base of the pair of charging pins. A phase change material disposed in the pair of porous metallic cages. The pair of porous metallic cages are made from a metal foam or a metal mesh. A vapor chamber is disposed between the base of the pair of charging pins and the pair of porous cage.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The drawings described herein are for illustrative purposes only of selected embodiments and not all possible implementations, and are not intended to limit the scope of the present disclosure.

In the drawings, reference numbers may be reused to identify similar and/or identical elements.

DETAILED DESCRIPTION

Figure 1:
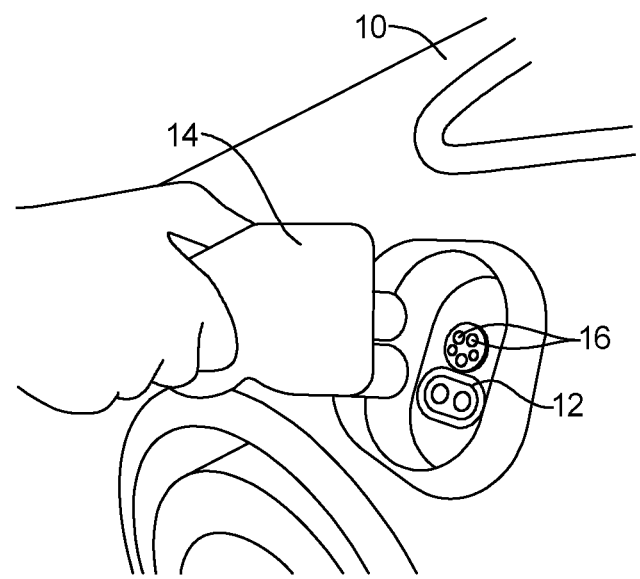
FIG. 1 is an exemplary perspective view of a DC fast charging port according to the principles of the present disclosure.
Figure 2:
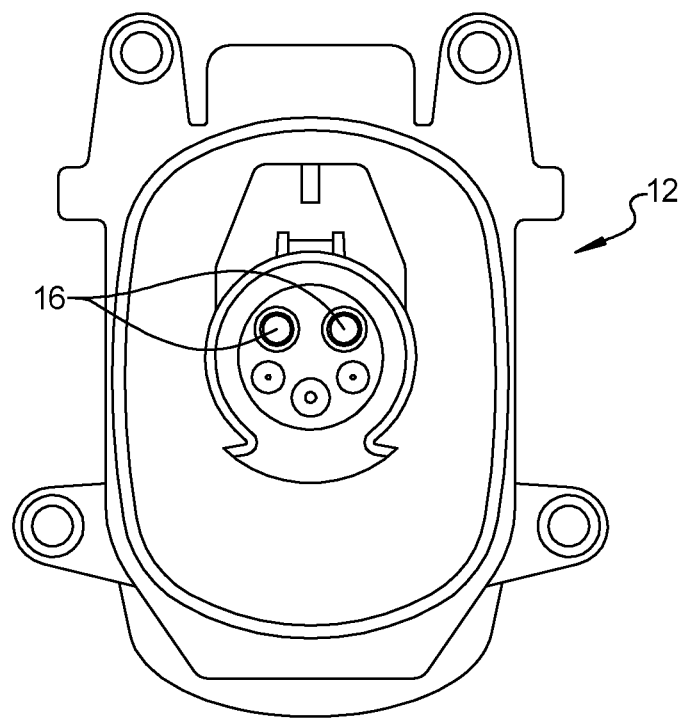
FIG. 2 is a plan view of the DC fast charging port.

With reference to FIG. 1, a vehicle 10 is shown including a vehicle charging port 12. A DC fast charging plug 14 of a charging station is illustrated being plugged into the charging port 12 by a user. The charging port 12 typically includes two charging pins 16 (best shown in FIG. 2) each adapted to be engaged by the DC fast charging plug 14. The charging pins 16 each include a base region 18 connected to a charging cable 20 which is covered by a sheath 22.

Figure 3:
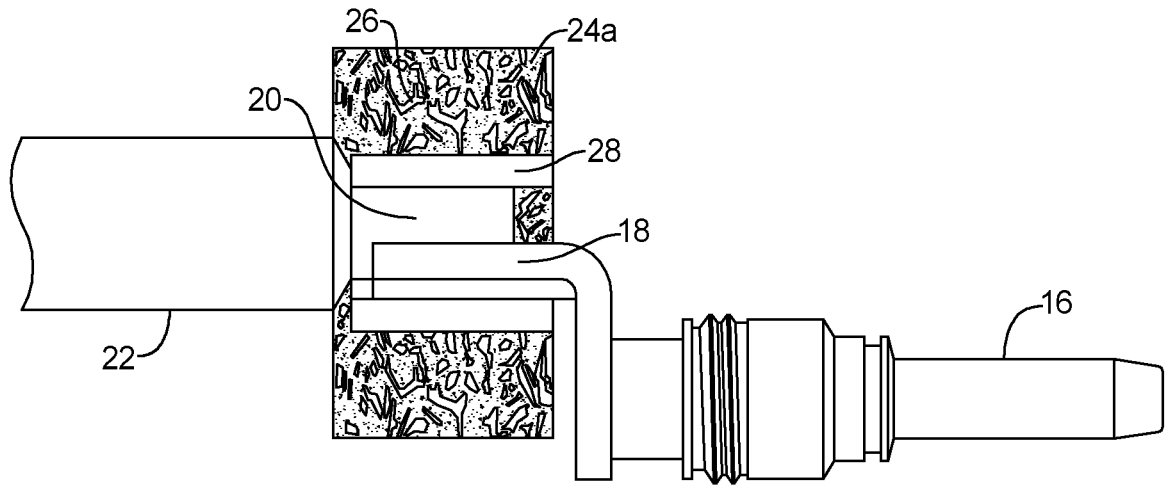
FIG. 3 is a schematic view of metal foam and phase changing material surrounding a base of a charge pin according to the principles of the present disclosure.
Figure 4:
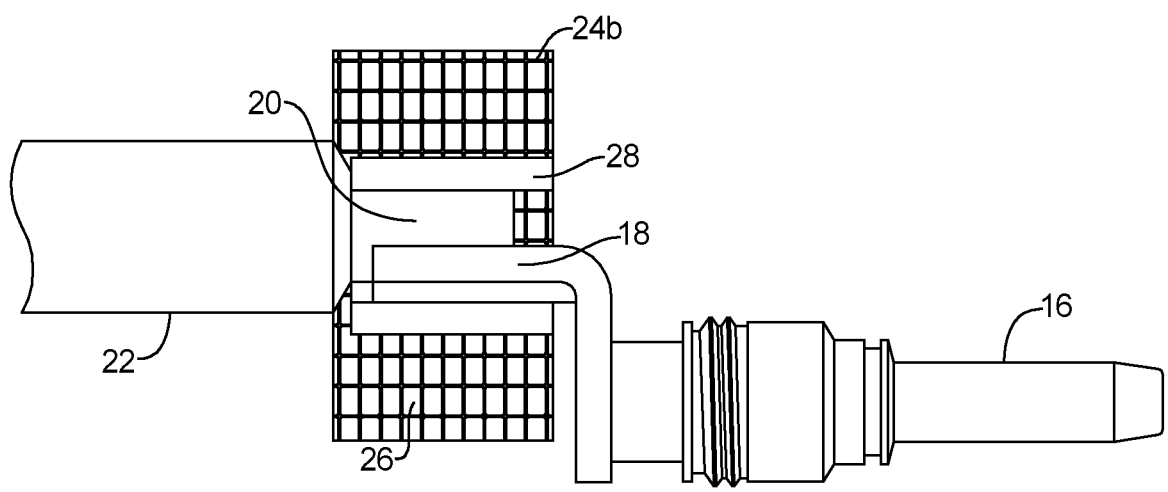
FIG. 4 is a schematic view of metal mesh and phase changing material surrounding a base of a charge pin according to the principles of the present disclosure.

As shown in FIG. 3, the base region 18 of the charging pins are surrounded by a porous metallic or graphite cage 24a, 24b having phase change material 26 encased within the pores of the metallic or graphite cage 24a, 24b. The porous metallic or graphite cage 24a, 24b can include a metallic or graphite foam 24a, as shown in FIG. 3, or a metallic mesh 24b as shown in FIG. 4. For purposes of this disclosure, the porous metallic or graphite cage 24a, 24b or the metallic mesh 24b are referred to as a high thermal conductivity cage 24. A vapor chamber 28 can optionally be disposed between the high thermal conductivity cage 24 and the base region 18 of the charging pin 16. Phase change materials (PCMB) are substances which absorb or release large amounts of so-called "latent" heat when they go through a change in their physical state, i.e., from solid to liquid. Exemplary phase change materials can include paraffin waxes and salt hydrates. The phase change material 26 is capable of absorbing a great amount of heat and in combination with the metal or graphite foam 24a or metal mesh 24b greatly improves the cooling capacity of the phase change material 26. In particular, the cooling capacity of the phase change material 26 is defined by the Figure of Merit equation: FOM=$\sqrt{k\rho L}$; where k=thermal conductivity; ρ=Density; and L=Latent Heat. Because phase change material such as paraffin wax has a relatively small thermal conductivity of k=0.15 w/m/k, the high thermal conductivity cage 24 is dispersed throughout the phase change material 26 to enhance the overall thermal conductivity. The use of an optional vapor chamber 28 can also be utilized to enhance the heat absorption. The vapor chamber 28 can include an enclosed chamber including 5-10% of a fluid such as methanol, ammonia, water and acetone that can change to a vapor when heated. Accordingly, the present disclosure integrates the phase change material 26 with an optional vapor chamber 28 and high thermal conductivity (metal or graphite) foam or mesh 24 to provide faster response of transient heat generation.

An example calculation for a required phase change material volume for a phase change material having a density of ρ=820 kg/m³, a latent heat of 240 kJ/KG and CP=2.85 kJ/kg-K (wherein "CP" is a specific heat capacity of the material), wherein for a 30 W heat generation during 20 minute charge at 500 Amp produces about 36 KJ of heat. Allowing a 20 degree temperature rise of the phase change material results in a required phase change material volume of 148 mL.

Figure 5:
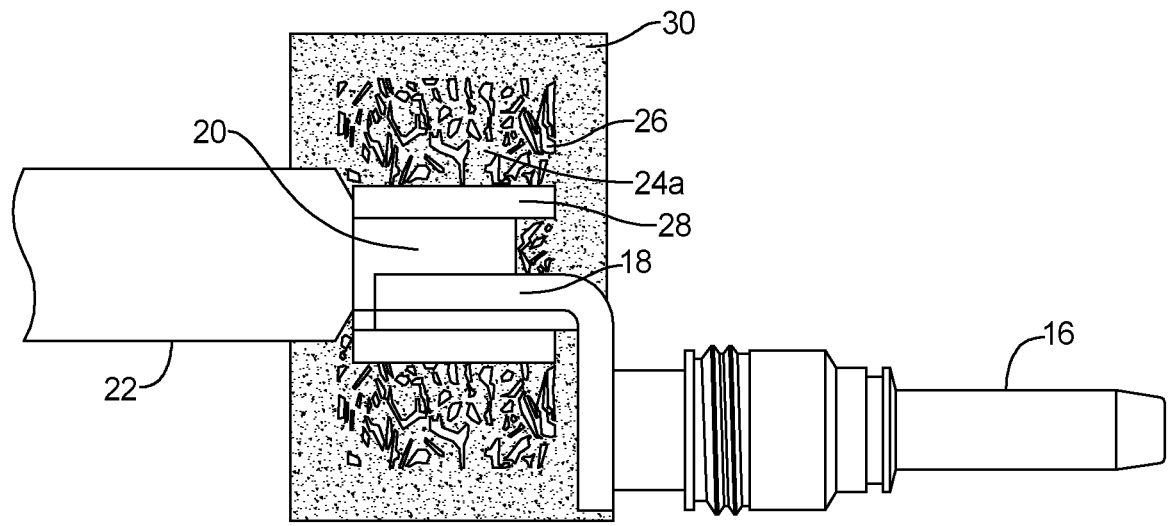
FIG. 5 is a schematic view of metal foam and phase changing material encased in metal foam that surrounds a base of a charge pin according to the principles of the present disclosure.
Figure 6:
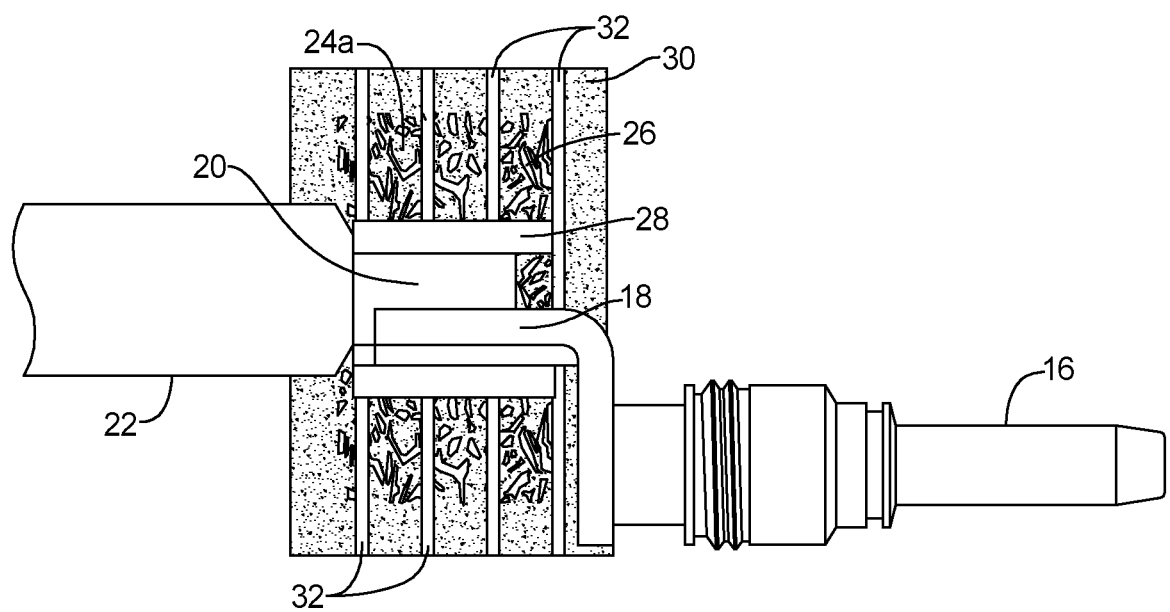
FIG. 6 is a schematic view of metal foam and phase changing material with heat pipes disposed therein and surrounding a base of a charge pin according to the principles of the present disclosure.

With reference to FIG. 5, the porous metal case 24a, 24b can be encased with extra porous metallic material 30 such as metal foam or metal mesh to dissipate the heat transfer from pins to the phase change material and reduce the time for regeneration during off-cycle.

As a further option, heat pipes 32 can be disposed within the porous high thermal conductivity cage 24a, 24b in order to further enhance the heat transfer from the heat source to ambient along with the phase change material 26 and porous high thermal conductivity cage 24a, 24b.

Figure 7:
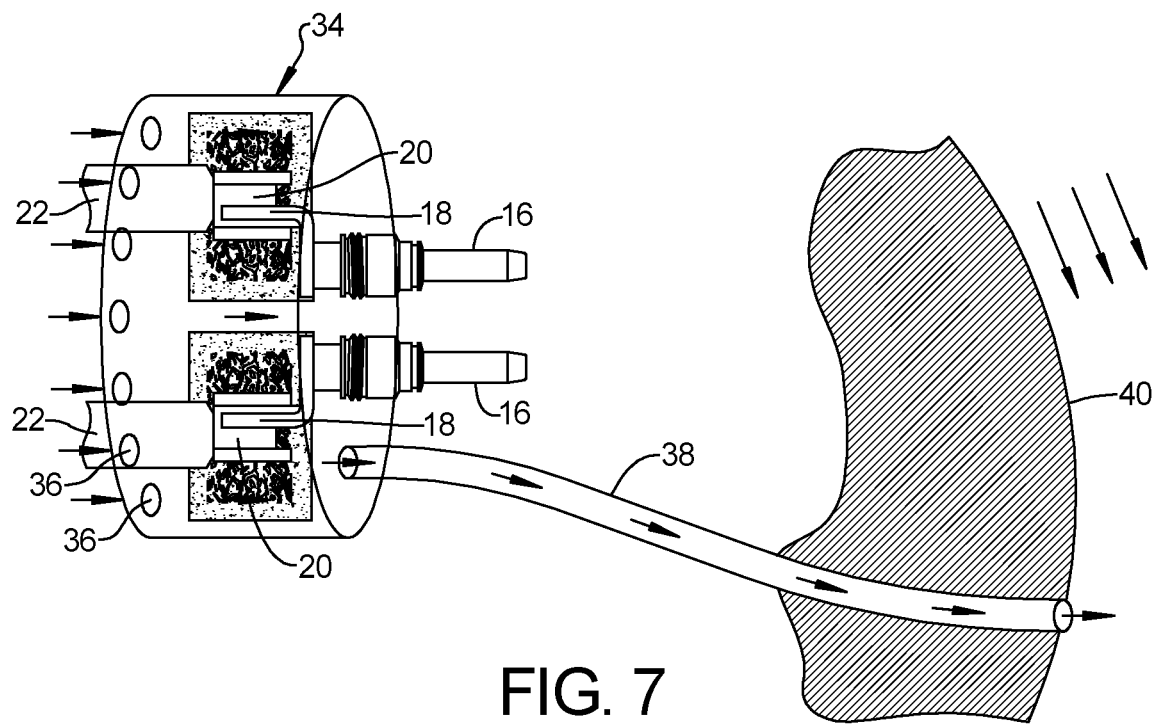
FIG. 7 is a schematic view of metal foam and phase changing material with cooling air passages disposed therein and surrounding a base of a charge pin and vented to an exterior of the vehicle according to the principles of the present disclosure.
Figure 8:
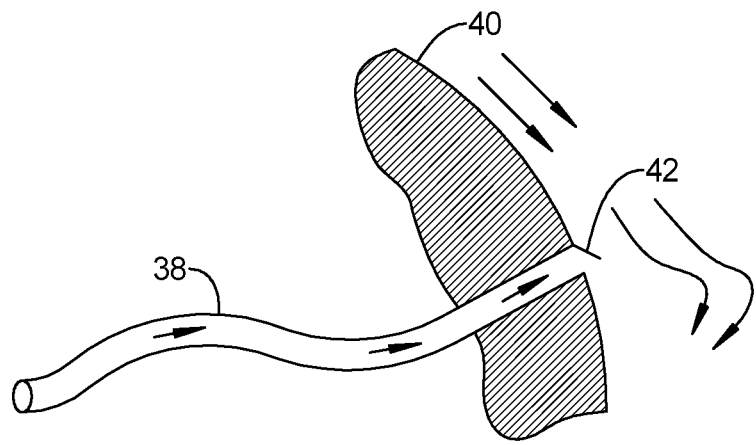
FIG. 8 is a schematic view showing an alternative passive air flow system by pressure differential.
Figure 9:
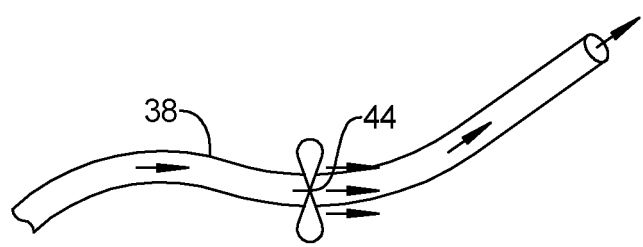
FIG. 9 is a schematic view showing an alternative active air flow system.

As shown in FIG. 7, the base regions 18 and the porous high thermal conductivity cages 24a, 24b of the charging pins 16 can be surrounded with a cover 34 including airflow passages 36 there through. A discharge air duct 38 can be connected to the interior of the cover 34 and in communication to an exterior surface 40 of the vehicle 10. Accordingly, airflow across the exterior surface of the vehicle can further assist cooling to the charging pins while the vehicle is being driven after the charging event. According to further aspects, as shown in FIG. 8, the air duct 38 can be provided with a flow separator 42 in a location of air flow so that a pressure differential is generated in the air duct 38 in order to passively draw air through the cover 34. Finally, as shown in FIG. 9, the air duct 38 can be provided with a fan 44 to provide active air flow through the cover 34 that can be activated during and after a charging event.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

What is claimed is:

1. An electric vehicle charging port, comprising:
a pair of charging pins each connected to a respective charging cable by a base;
a pair of porous cages surrounding the base of the pair of charging pins, the pair of porous cages are made from one of a metal foam, a graphite foam and a metal mesh; and
a phase change material disposed in the pair of porous cages.

2. The electric vehicle charging port according to claim 1, wherein the phase change material includes one of a paraffin wax or a salt hydrate.

3. The electric vehicle charging port according to claim 1, further comprising a pair of vapor chambers disposed between the respective base of the pair of charging pins and a respective one of the pair of porous cages.

4. The electric vehicle charging port according to claim 3, wherein the vapor chamber includes one of methanol, ammonia, water and acetone therein.

5. The electric vehicle charging port according to claim 1, further comprising a metal housing surrounding the pair of porous cages.

6. The electric vehicle charging port according to claim 1, further comprising a plurality of heat pipes disposed in the pair of porous cages.

7. The electric vehicle charging port according to claim 1, further comprising a plurality of air flow passages in the pair of porous cages.

8. The electric vehicle charging port according to claim 7, further comprising an air duct in communication with the plurality of air flow passages.

9. The electric vehicle charging port according to claim 8, further comprising a fan disposed in communication with the air duct.

10. An electric vehicle, comprising:
a vehicle body; and
an electric vehicle charging port disposed on the vehicle body and including
a pair of charging pins each connected to a respective charging cable by a base;
a pair of porous cages surrounding the base of the pair of charging pins, the pair of porous cages are made from one of a metal foam, a graphite foam and a metal mesh; and
a phase change material disposed in the pair of porous cages.

11. The electric vehicle according to claim 10, wherein the phase change material includes one of a paraffin wax or a salt hydrate.

12. The electric vehicle according to claim 10, further comprising a pair of vapor chambers disposed between the respective base of the pair of charging pins and a respective one of the pair of porous cages.

13. The electric vehicle according to claim 10, further comprising a plurality of air flow passages in the pair of porous cages.

14. The electric vehicle according to claim 13, further comprising an air duct in communication with the plurality of air flow passages.

15. The electric vehicle according to claim 14, further comprising a fan disposed in communication with the air duct.

16. The electric vehicle according to claim 12, wherein the vapor chamber includes one of methanol, ammonia, water and acetone therein.

17. The electric vehicle according to claim 10, further comprising a metal housing surrounding the pair of porous cages.

18. The electric vehicle according to claim 10, further comprising a plurality of heat pipes disposed in the pair of porous cages.

19. The electric vehicle according to claim 10, further comprising a housing surrounding the pair of porous cages.

20. The electric vehicle charging port according to claim 1, further comprising a housing surrounding the pair of porous cages.

* * * * *